United States Patent
Yang et al.

(10) Patent No.: US 11,205,700 B2
(45) Date of Patent: Dec. 21, 2021

(54) AIR GAP SPACER AND RELATED METHODS

(71) Applicant: Taiwan Semiconductor Manufacturing Co., Ltd., Hsin-Chu (TW)

(72) Inventors: Chan Syun David Yang, Taipei (TW); Li-Te Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/504,117

(22) Filed: Jul. 5, 2019

(65) Prior Publication Data

US 2020/0020776 A1  Jan. 16, 2020

Related U.S. Application Data

(60) Provisional application No. 62/698,600, filed on Jul. 16, 2018.

(51) Int. Cl.
| | | |
|---|---|---|
| *H01L 29/10* | (2006.01) | |
| *H01L 29/66* | (2006.01) | |
| *H01L 21/3065* | (2006.01) | |
| *H01L 29/78* | (2006.01) | |

(52) U.S. Cl.
CPC ...... *H01L 29/1033* (2013.01); *H01L 21/3065* (2013.01); *H01L 29/66636* (2013.01); *H01L 29/66795* (2013.01); *H01L 29/785* (2013.01)

(58) Field of Classification Search
CPC ............. H01L 29/1033; H01L 21/3065; H01L 29/66636; H01L 29/66795; H01L 29/785
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,330,963 | B2 * | 5/2016 | King ................ H01L 21/76877 |
| 9,520,482 | B1 | 12/2016 | Chang et al. |
| 9,548,303 | B2 | 1/2017 | Lee et al. |

(Continued)

*Primary Examiner* — Fernando L Toledo
*Assistant Examiner* — Neil R Prasad
(74) *Attorney, Agent, or Firm* — Haynes and Boone, LLP

(57) ABSTRACT

A method of forming an air-gap spacer in a semiconductor device includes providing a device including a gate stack, a plurality of spacer layers disposed on a sidewall of the gate stack, and a source/drain feature adjacent to the gate stack. In some embodiments, a first spacer layer of the plurality of spacer layers is removed to form an air gap on the sidewall of the gate stack. In various examples, a first sealing layer is then deposited over a top portion of the air gap to form a sealed air gap, and a second sealing layer is deposited over the first sealing layer. Thereafter, a first self-aligned contact (SAC) layer is etched from over the source/drain feature using a first etching process. In various embodiments, the first etching process selectively etches the first SAC layer while the first and second sealing layers remain unetched.

20 Claims, 10 Drawing Sheets

(56) References Cited

U.S. PATENT DOCUMENTS

| | | |
|---|---|---|
| 9,576,814 B2 | 2/2017 | Wu et al. |
| 10,026,824 B1 * | 7/2018 | Chanemougame ............................ H01L 21/76805 |
| 2013/0285116 A1 | 10/2013 | Lochtefeld et al. |
| 2014/0179101 A1 * | 6/2014 | Lee .................... H01L 21/76897 438/666 |
| 2015/0091089 A1 * | 4/2015 | Niebojewski ..... H01L 29/66575 257/347 |
| 2015/0243544 A1 * | 8/2015 | Alptekin ............. H01L 29/6653 438/586 |
| 2018/0166255 A1 * | 6/2018 | Blomberg ......... H01L 21/32135 |
| 2019/0198635 A1 * | 6/2019 | Zhang ............... H01L 29/66545 |

\* cited by examiner

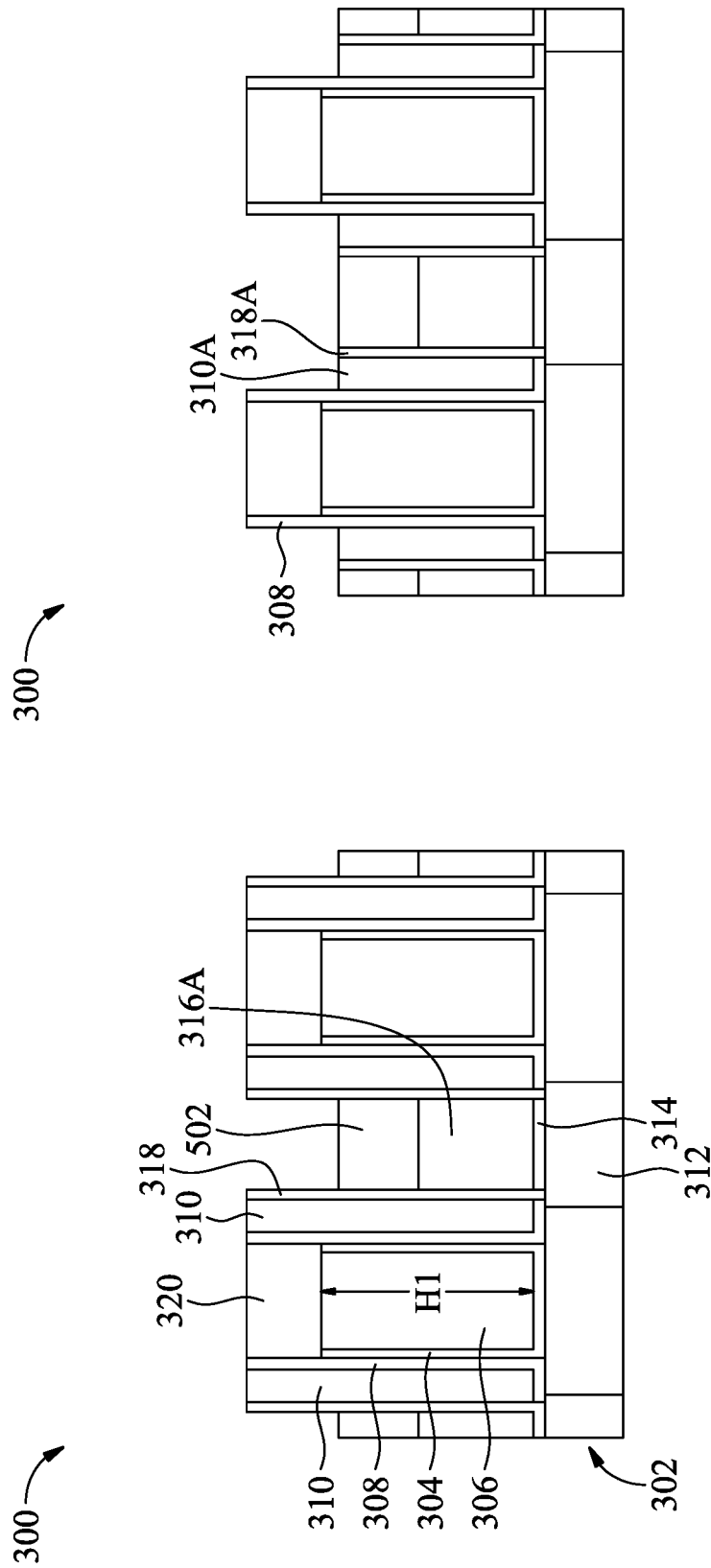

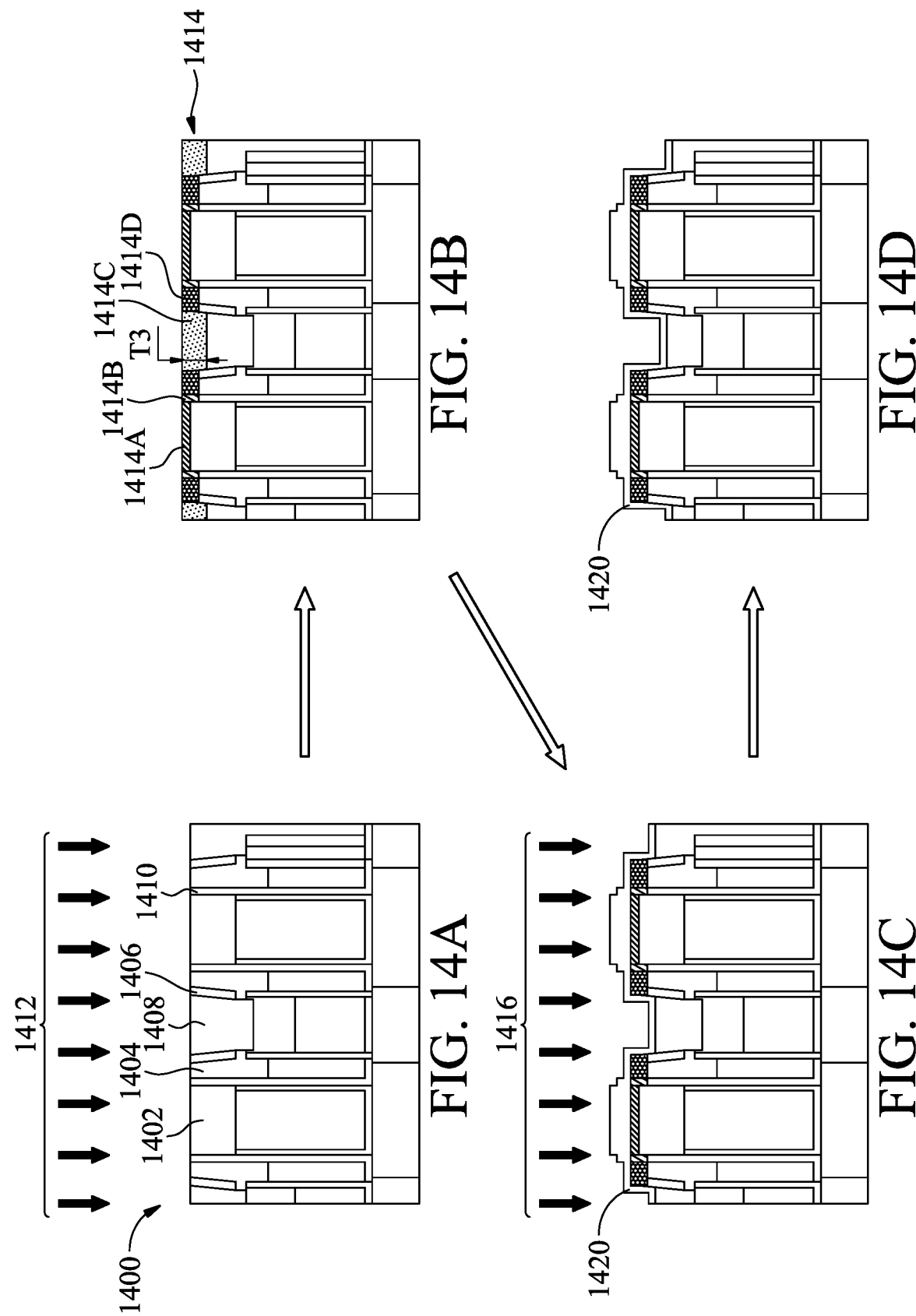

AIR GAP SPACER AND RELATED METHODS

CROSS-REFERENCE TO RELATED APPLICATION

This application claims the benefit of U.S. Provisional Application No. 62/698,600, filed Jul. 16, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased parasitic capacitance (e.g., between a FinFET gate and source/drain regions or source/drain contacts). As a result of such increased parasitic capacitance, device performance is degraded. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-13 provide cross-sectional views along a plane substantially parallel to a plane defined by section AA' of FIG. 1, of an exemplary device fabricated according to one or more steps of the method of FIG. 2;

FIGS. 14A-14D illustrate an exemplary first cycle of an ALE etch process flow, according to some embodiments.

DETAILED DESCRIPTION

Figure 1:
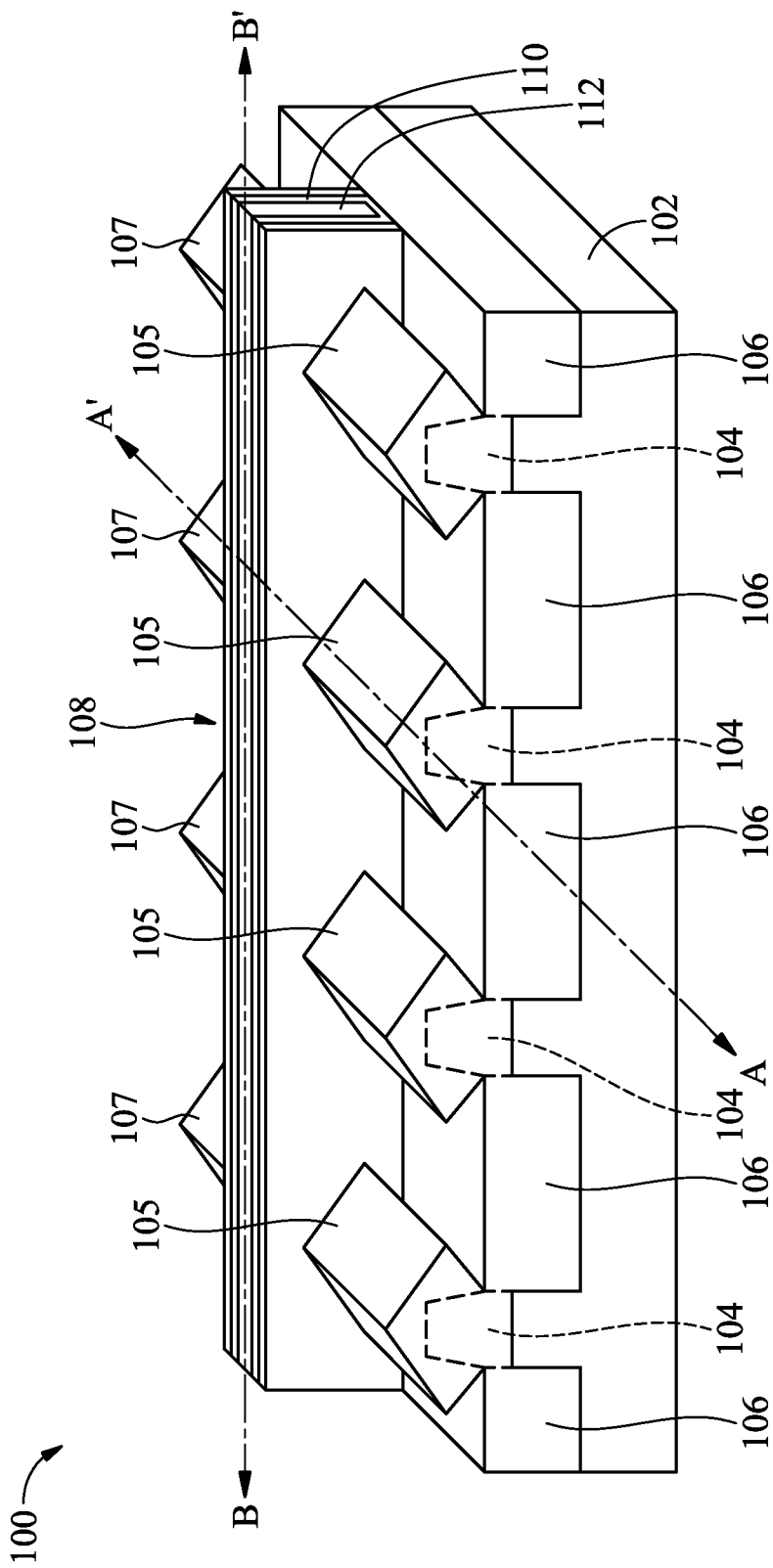
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack including a gate dielectric layer 110, and a metal layer 112 formed over the gate dielectric layer. In some embodiments, the gate dielectric layer 110 may include an interfacial layer formed over the channel region of the fin 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods. The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As noted above, aggressive scaling down of IC dimensions has resulted in increased parasitic capacitance (e.g., between a FinFET gate and source/drain regions or source/drain contacts), thus degrading device performance. In particular, the parasitic capacitance contribution of sidewall spacers has become a greater portion of the total parasitic capacitance of a FinFET device. To address this issue, air gap sidewall spacers have been introduced, for example, as a replacement to one of more of the dielectric materials used in conventional sidewall spacers (e.g., such as formed on sidewalls of the gate structure 108). For clarity in the discussion that follows, such air gap sidewall spacers may be referred to simply as "air-gap spacers". In various embodiments, air-gap spacers provide a lower dielectric constant than the dielectric materials used in conventional sidewall spacers. Thus, devices that employ air-gap spacers generally have reduced parasitic capacitance and improved performance.

However, formation of high-quality air-gap spacers remains a challenge. For instance, as part of the process of forming air-gap spacers, one or more sealing layers may be formed over an air gap adjacent to a gate sidewall to seal the air-gap spacer. In some examples, a porous low-K material (e.g., such as SiOC) may be used as the sealing layer. Further, as part of a self-aligned contact (SAC) process flow, or a dual SAC process flow, it may be desirable to etch a dielectric layer (e.g., such as SiN, $ZrO_x$, or other dielectric layer) to expose an underlying contact (e.g., source/drain or gate contact) without damaging a previously formed sealing layer of an adjacent air-gap spacer. Stated another way, it is desirable to provide a dielectric layer (e.g., SiN, $ZrO_x$, etc.) etching process having a high etch selectivity of the dielectric layer to the air gap sealing layer (e.g., the porous low-K material). For purposes of this discussion, a "high etch selectivity" may be defined as a selectivity greater than or equal to about 12.

At least some existing dielectric etch processes (e.g., SiN etch processes) are not able to achieve such a high etch selectivity to a porous low-K material. For example, in some cases, conventional SiN etch chemistries may etch porous low-K materials (e.g., such as SiOC) too fast. By way of illustration, at least some conventional SiN etch chemistries include $CH_3F/H_2$, $CH_3F/O_2$, or $CHF_3/CF_4/Ar$. In general, and in addition to etching SiN, etching plasmas formed using these etch chemistries may also etch porous low-K materials (e.g., SiOC). Thus, there is a narrow control window to protect the porous low-K materials (e.g., SiOC) from etching by the SiN etching plasma. Further, due to their function as a seal over the air gap, any sealing layer loss (e.g., loss of the porous low-K material) is limited to only a few nanometers, as excessive sealing layer loss will result in a broken seal that will cause air gap damage. In some examples, and due to the low etch selectivity of SiN to SiOC as in some current etch processes, an increase in the thickness of dielectric layer (e.g., such as SiN) and the porous low-K materials (e.g., SiOC) may be needed to ensure that a device gate height is sufficient. However, an increase in the device gate height, and a corresponding increased aspect ratio, makes front-end poly etching and cleaning processes more difficult and results in etch residues, poly line bending or collapse, and generally degrades device yield. Further, in a subsequent CMP process, additional polish depth may be needed to achieve adequate device planarization. In some examples, such additional CMP polishing, and associated layer loss, may result in an effective gate height reduction. Generally, as technology continues to advance, the smaller CDs and higher aspect ratios will allow for no process window with the current low etch selectivity, for example of SiN to SiOC, while maintaining the required gate height. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for providing air-gap spacers (e.g., protected by multiple layers of seal materials) that provide a reduced spacer dielectric constant and enhanced device performance. In particular, embodiments disclosed herein provide for the formation of high-quality air-gap spacers, for example, as part of a dual SAC process flow, as described in more detail below. In some embodiments, first and second sealing layers may be formed over an air gap adjacent to a device gate structure to seal the air-gap spacer. The sealing layers may merge over the air gap to provide the sealed air-gap spacer. As noted above, a porous low-K material (e.g., such as SiOC) may be used to form the first and/or second sealing layers. In addition, as part of the dual SAC process flow, embodiments of the present disclosure provide a dielectric layer (e.g., SiN, $ZrO_x$, etc.) etching process having a high etch selectivity (e.g., >12) of the dielectric layer to the first and second air gap sealing layers (e.g., SiOC). In so doing, the various disclosed embodiments avoid air gap exposure/damage while minimizing gate height loss.

In some embodiments, the high selectivity etching process employs a hydrogen modification atomic layer etching (ALE) etch process to enhance etch selectivity. Generally, ALE processes provide for the precise removal of atomic layers of a material and includes a sequence of steps alternating between self-limiting chemical surface modification steps and etching steps which remove the chemically-modified surface regions. By providing such self-limiting surface modification and etching steps, ALE processes are able to provide much more precise etch control and etch selectivity, for example as compared to a reactive ion etching (RIE) process. In various embodiments disclosed herein, a hydrogen modification ALE SiN etch process may be used to enhance SiN to SiOC etch selectivity. By way of example, the ALE etch process consists of two steps including: (1) surface modification by $H_2$ plasma on SiN and SiOC surfaces, and (2) etching with F radicals to remove the surface modification layer on SiN while keeping the surface modification layer (e.g., as referred to as an etch stop layer) on SiOC surfaces. In some cases, a purging step may be performed after one or both of the surface modification and etching steps. In some examples, the ALE SAC material (e.g., SiN) removal process provides high etch selectivity to the porous low-K spacer materials (e.g., SiOC) and thus provides a wide etch process window in a dual SAC flow. Additionally, in various embodiments, a high ZrO etch selectivity (e.g., >25) to SiOC sealing layers and to SiN may be obtained by performing processing at a higher pressure. In some cases, a higher pressure may help to remove sidewall stringers due to additional boron that forms volatile ZrBOCl and removes ZrO stringers.

In addition, embodiments of the present disclosure provide a SiN etch stop on ZrO with a high etch selectivity that enables a robust and wider dual SAC etch process window. Thus, in some embodiments, a SAC SiN layer height may be reduced, resulting in a reduction in the total gate height required for a front-end poly etching/cleaning processes and providing wider etch process control. In various examples, the ALE SiN etch selectivity behavior makes SiN a good SAC material during a dual SAC SiN etch process and during a SiN break-through etch process. In addition, the high SiN to sealing layer (e.g., SiOC) etch selectivity helps ensure that the sealing layers do not break during a SAC etch process and ensures that there is no damage to the air-gap spacer. Further, the high SiN etch selectivity to the porous low-K SiOC sealing layers also provides for the reduction of SAC SiN height requirement, resulting in a reduced total gate height and aspect ratio. In some embodiments, the ALE SiN etch also demonstrates high etch selectivity to SAC ZrO materials and provides a wide process window for dual SAC etch processes. The lower gate height requirement afforded by the various embodiments will enhance the FEOL poly etching and cleaning process window while also providing for reduced etch residues, and reduced poly line collapsing and bending issues, and thus provide a more robust etch process window during MEOL etch. Therefore, the yield can be effectively improved. Additional embodiments and advantages are discussed below and/or will be evident to those skilled in the art in possession of this disclosure.

Figure 2:
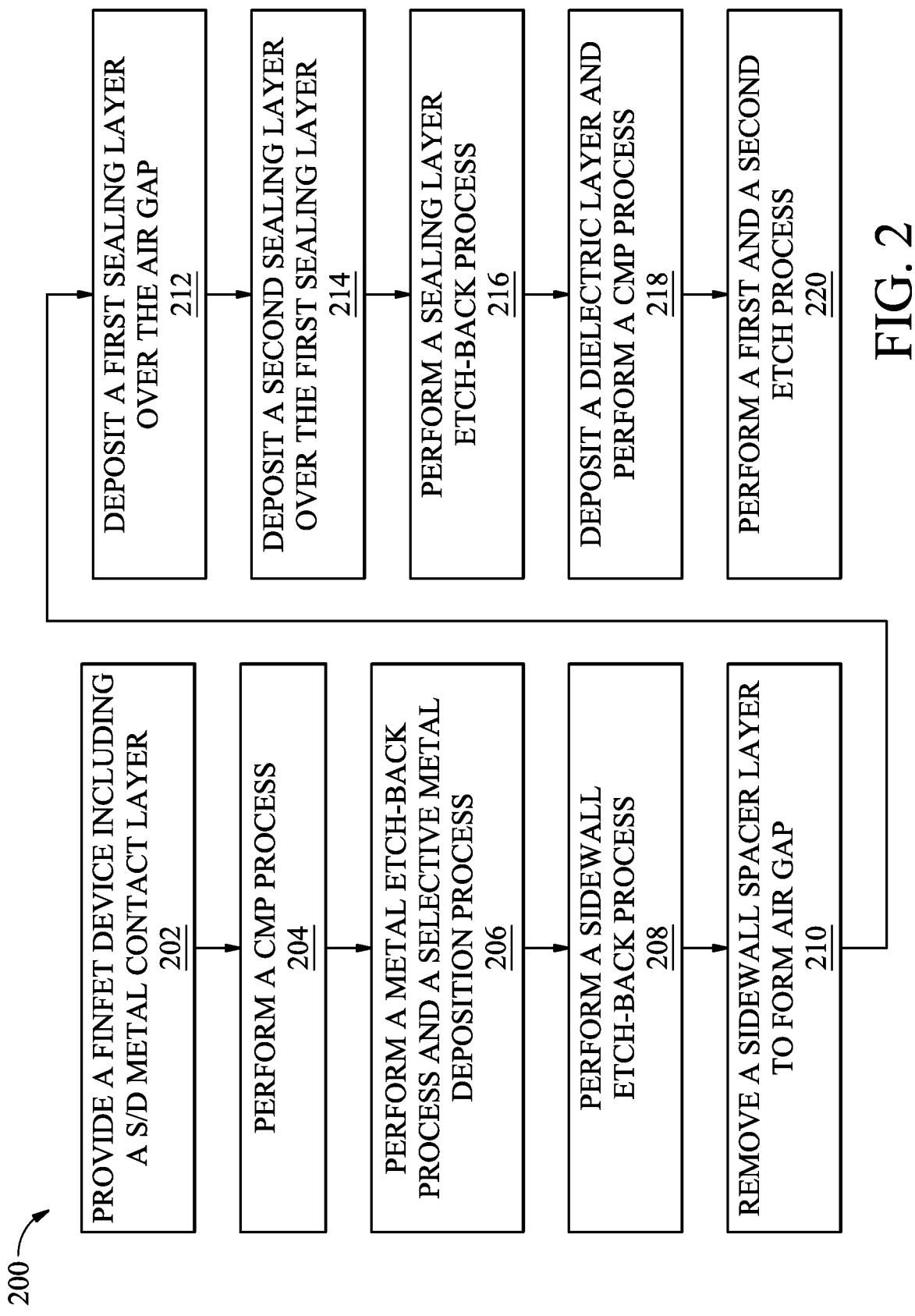
FIG. 2 is a flow chart of a method of fabricating a semiconductor device including an air-gap spacer, in accordance with some embodiments.
Figure 4:
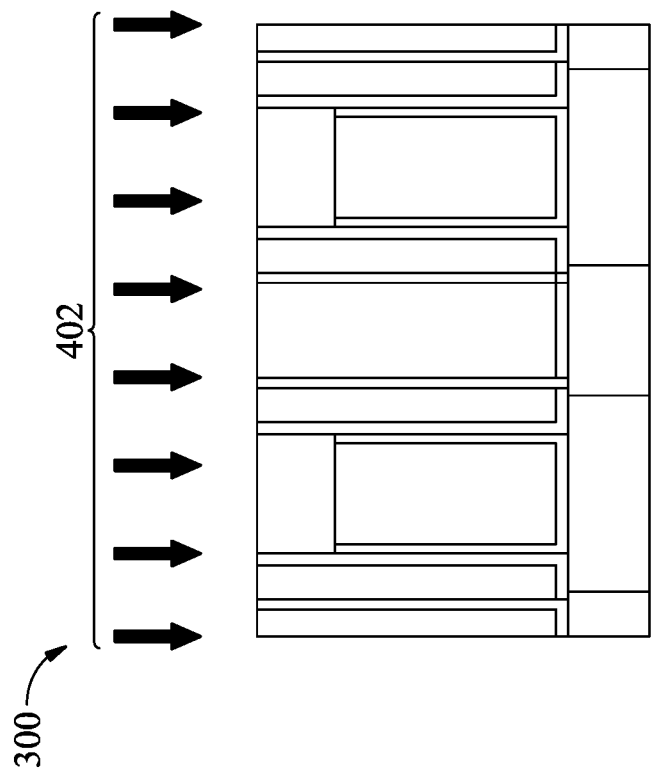

Referring now to FIG. 2, illustrated is a method 200 of fabricating a semiconductor device (e.g., such as a FinFET device) including an air-gap spacer, for example as part of a dual SAC process flow, in accordance with one or more embodiments. In some embodiments, the method 200 may be used to fabricate the device 100, described above with reference to FIG. 1. Thus, one or more aspects discussed above with reference to the device 100 may also apply to the method 200. Additionally, FIGS. 3-13 provide cross-sectional views, along a plane substantially parallel to a plane defined by section AA' of FIG. 1, of an exemplary device 300 fabricated according to one or more steps of the method 200 of FIG. 2.

It is understood that parts of the method 200 and/or the semiconductor device 300 may be fabricated by a well-known CMOS technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 3:
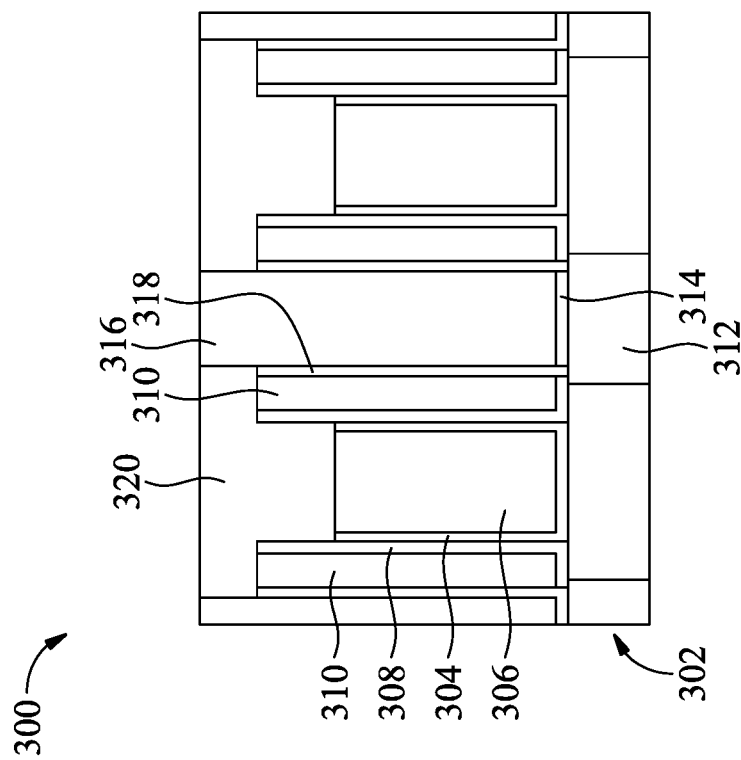

Referring now to the method 200, the method 200 begins at block 202 where a FinFET device including a source/drain (S/D) metal contact layer is provided. Referring to FIG. 3, and in an embodiment of block 202, illustrated therein is a FinFET device 300 including a fin 302 that extends from a substrate, a gate stack including a gate dielectric layer 304, and a metal layer 306 over the gate dielectric layer 304. In some embodiments, the substrate, the fin 302, the gate dielectric layer 304, and the metal layer 306 may be substantially similar to the substrate 102, the fin elements 104, the gate dielectric layer 110, and the metal layer 112 discussed above with reference to FIG. 1. In some examples, the metal layer 306 has a height 'H1' in a range from about 30-40 nm. The device 300 also includes a first spacer layer 308 and a second spacer layer 310 formed on sidewalls of the gate stack. In some embodiments, the spacer layers 308, 310 may include a dielectric material such as silicon oxide, SiN, SiC, SiON, SiOC, SiOCN, SiCN, or combinations thereof.

In some embodiments, the device 300 includes epitaxial source/drain features 312 which may be formed by one or more epitaxial processes. In some cases, the epitaxial source/drain features 312 may be formed in, on, and/or surrounding the fin 302. In various examples, a silicide layer 314 may be formed over the epitaxial source/drain features 312 to reduce contact resistance. In some embodiments, the silicide layer 314 may include Co silicide, Ni silicide, or Ti silicide. Further, in some embodiments, a metal contact layer 316 may be formed over the silicide layer 314 to provide electrical contact to the epitaxial source/drain features 312. In at least some examples, the metal contact layer 316 includes a Co layer, although other suitable metals may be used without departing from the scope of the present disclosure. In some embodiments, a liner layer 318 is formed on sidewalls of the metal contact layer 316, such that the liner layer 318 interposes the spacer layer 310 and the metal contact layer 316. In some examples, the liner layer 318 may be formed prior to forming the metal contact layer 316. In some embodiments, the liner layer 318 includes a SiN layer.

By way of example, the device 300 may also include a first SAC layer 320 formed over the gate stack and the spacer layers 308, 310. In some examples, the first SAC layer 320 includes a dielectric layer such as a $ZrO_2$ layer.

The method 200 then proceeds to block 204 where after forming the S/D metal contact layer (block 202), a CMP process is performed. For example, with reference to FIGS. 3 and 4 and in an embodiment of block 204, a CMP process 402 may be performed to remove portions of the metal contact layer 316 and the first SAC layer 320, and to planarize a top surface of the device 300.

After the CMP process (block 204), the method 200 proceeds to block 206 where a metal etch-back process and a selective metal deposition process are performed. Referring to FIG. 5, and in an embodiment of block 206, a metal etch-back process is performed to etch-back the metal contact layer 316 and thus provide an etched-back metal contact layer 316A. In some embodiments, for example when the metal contact layer 316 includes Co, the metal etch-back process includes a Co etch-back process. In various examples, the metal etch-back process may include a wet etch, a dry etch, or a combination thereof. After the metal etch-back process, and in a further embodiment of block 206, a metal layer 502 is selectively deposited over the etched-back metal contact layer 316A. In some embodiments, the metal layer 502 includes W, although other suitable metals may also be used. In various embodiments, the metal layer 502 may be selectively deposited using CVD, ALD, PVD, or other suitable method.

The method 200 then proceeds to block 208 where a sidewall etch-back process is performed. With reference to FIGS. 5 and 6, and in an embodiment of block 208, a sidewall etch-back process is performed. In some embodiments, the sidewall etch-back process may be used to etch-back the second spacer layer 310 and the liner layer 318, and thus provide an etched-back second spacer layer 310A and an etched-back liner layer 318A. In some examples, the sidewall etch-back process may include a wet etch, a dry etch, or a combination thereof. Further, in some embodiments, the sidewall etch-back process may include an isotropic sidewall etch-back process.

Figure 7:
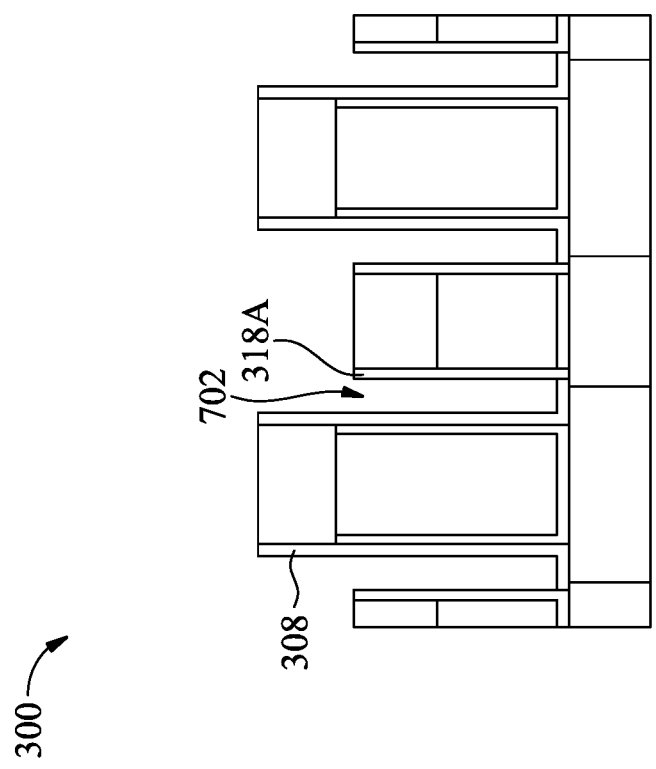

After performing the sidewall etch-back process (block 208), the method 200 proceeds to block 210 where a sidewall spacer layer is removed. With reference to FIGS. 6 and 7, in an embodiment of block 210, the etched-back second spacer layer 310A may be removed to form an air gap 702. In some embodiments, the etched-back second spacer layer 310A may be removed using a dry etch, a wet etch, or a combination thereof. As noted above, the second spacer layer 310 may include an insulator (dielectric) such as silicon oxide, SiN, SiC, SiON, SiOC, SiOCN, SiCN, or combinations thereof. Thus, since the second spacer layer 310 is removed (or disposed of) to form the air gap 702, the air gap 702 may in some embodiments be referred to as a disposable insulator air gap.

Figure 8:
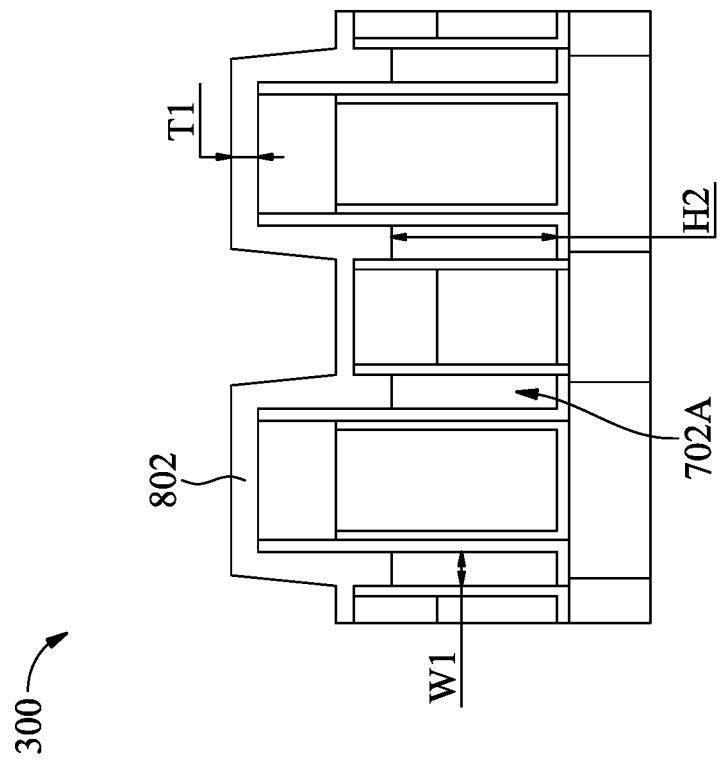

The method 200 proceeds to block 212 where a first sealing layer is deposited over the air gap. With reference to FIGS. 7 and 8, and in an embodiment of block 212, a first sealing layer 802 is deposited over the air gap 702. In some embodiments, the first sealing layer 802 is conformally deposited and overhangs/merges over a top portion of the air gap 702 formed by removal of the second spacer layer 310 (block 210) to form an air-gap spacer 702A that is sealed and unexposed. Thus, the air-gap spacer 702A (e.g., protected by multiple layers of seal materials) provides a reduced spacer dielectric constant and enhanced performance for the device 300. In some examples, the air-gap spacer 702A has a height 'H2' in a range from about 25-35 nm and a width 'W1' in a range from about 3-4 nm. In some embodiments, the first sealing layer 802 has a thickness 'T1' in a range from about 3-20 nm. In various embodiments, the first sealing layer 802 may include a porous low-K material such as SiOC, SiN, SiC, SiON, SiOCN, SiCN, or combinations thereof. In particular, in some embodiments, the first sealing layer 802 may include SiOC or SiOCN having about 2-10% C. In some embodiments, the first sealing layer 802 may be deposited using ALD, plasma enhanced ALD, CVD, plasma enhanced CVD, or other appropriate method. By way of example, the first sealing layer 802 may be deposited at a temperature of between about 250 C-650 C.

Figure 9:
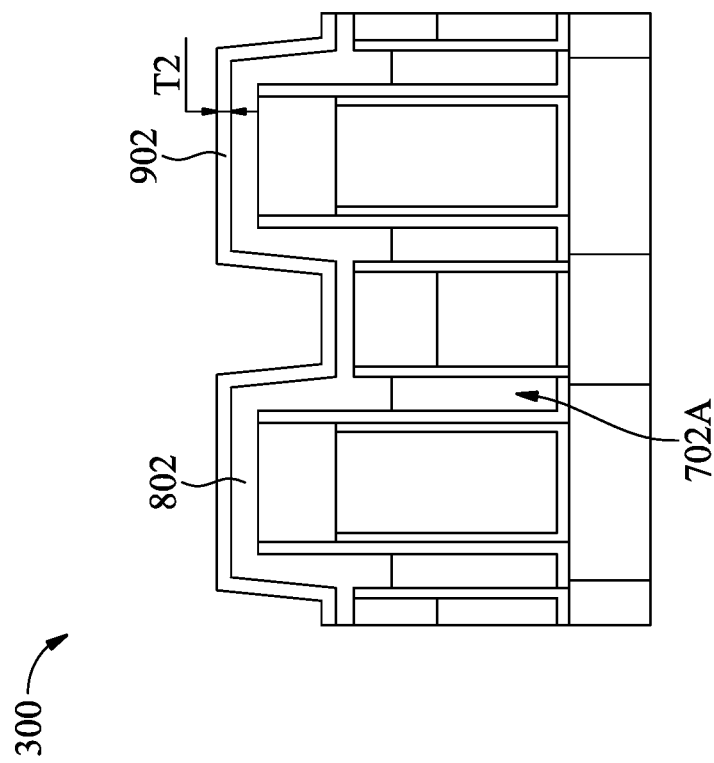

The method 200 proceeds to block 214 where a second sealing layer is deposited over the first sealing layer. With reference to FIGS. 8 and 9, and in an embodiment of block 214, a second sealing layer 902 is deposited over the first sealing layer 802. In some embodiments, the second sealing layer 902 is conformally deposited over the first sealing layer 802. In some embodiments, the second sealing layer 902 has a thickness 'T2' in a range from about 8-10 nm. Like the first sealing layer 802, the second sealing layer 902 may include a porous low-K material such as SiOC, SiN, SiC, SiON, SiOCN, SiCN, or combinations thereof. In particular, in some embodiments, the second sealing layer 902 may include SiOC or SiOCN having about 10-20% C. In various examples, the second sealing layer 902 may have a higher C content than the first sealing layer 802. By way of example, increasing the C content of the sealing layer (e.g., such as in the second sealing layer 902) provides for enhanced resistance to subsequent plasma etch processes. On the other hand, decreasing the C content of the sealing layer (e.g., such as in the first sealing layer 802) provides for greater control of the first sealing layer 802 to effectively overhang/merge over the top portion of the air gap 702 to form the sealed air-gap spacer 702A. In some embodiments, the second sealing layer 902 may similarly be deposited using ALD, plasma enhanced ALD, CVD, plasma enhanced CVD, or other appropriate method. By way of example, the second sealing layer 902 may be deposited at a temperature of between about 250 C-650 C. In various embodiments, the second sealing layer 902 may provide good plasma resistance, for example to a subsequent dual SAC etch and because of its increased C content. Additionally, in some embodiments, a ratio of thicknesses of the first sealing layer 802 to the second sealing layer 902 is in a range from about 1-3, depending on surface topology of the device 300.

Figure 10:
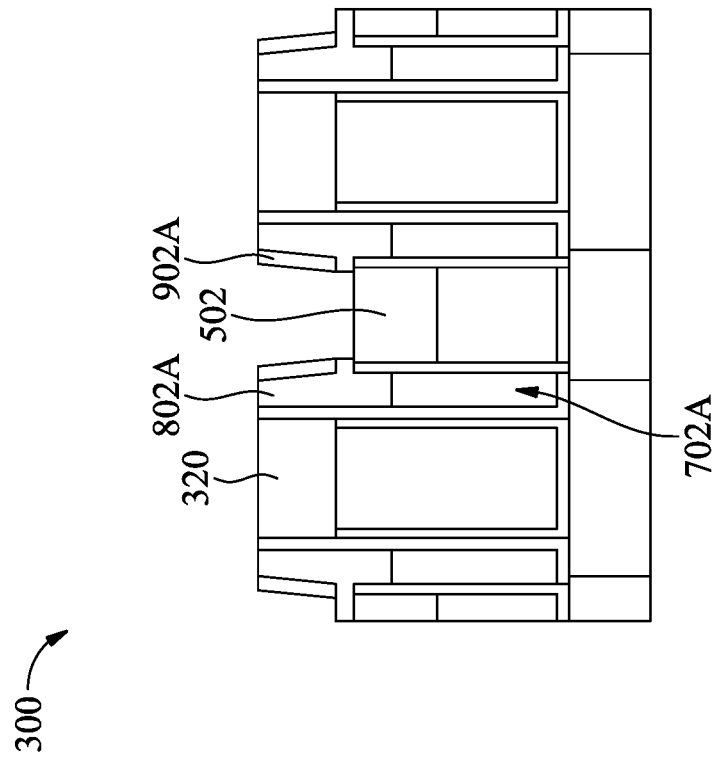

After deposition of the second sealing layer (block 214), the method 200 proceeds to block 216 where a sealing layer etch-back process is performed. Referring to FIGS. 9 and 10, in an embodiment of block 216, the sealing layer etch-back process may be used to etch-back the first sealing layer 802 and the second sealing layer 902, and thus provide an etched-back first sealing layer 802A and an etched-back second sealing layer 902A. In some examples, the sealing layer etch-back process may include a wet etch, a dry etch, or a combination thereof. As a result of the sealing layer etch-back process, and in some embodiments, top surfaces of each of the first SAC layer 320 and the metal layer 502 may be exposed. However, it is noted that even after the sealing layer etch-back process, the air-gap spacer 702A remains sealed and unexposed.

Figure 11:
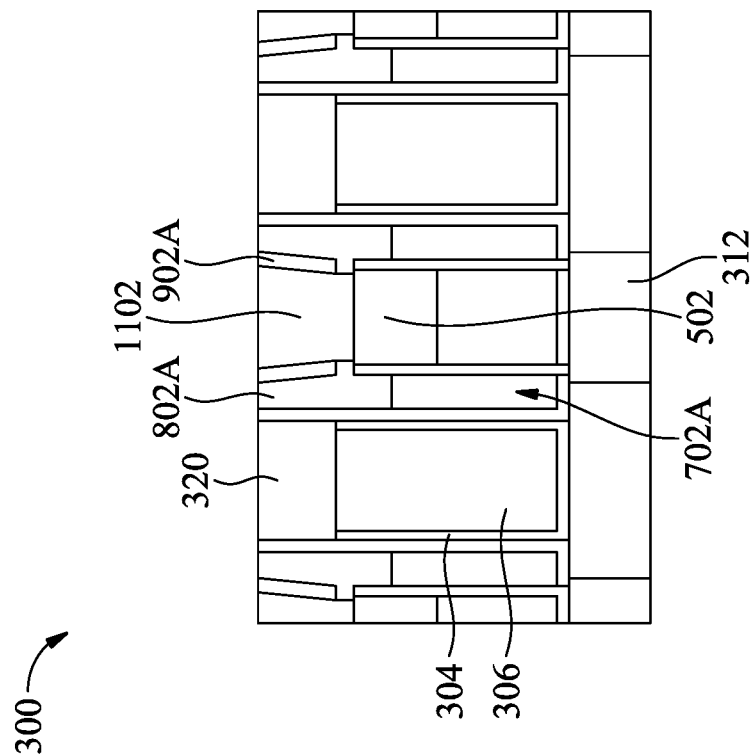

The method 200 then proceeds to block 218 where a dielectric layer is deposited, and a CMP process is performed. With reference to FIGS. 10 and 11, in an embodiment of block 218, a dielectric layer 1102 may be deposited over the device 300, and a CMP process may be performed to remove excess portions of the dielectric layer 1102 and to planarize a top surface of the device 300. In some embodiments, the dielectric layer 1102 may be equivalently referred to as a second SAC layer 1102. By way of example the second SAC layer 1102 may include a SiN layer. In some examples, the second SAC layer 1102 may be deposited by ALD, CVD, PVD, or by another suitable method.

Figure 12:
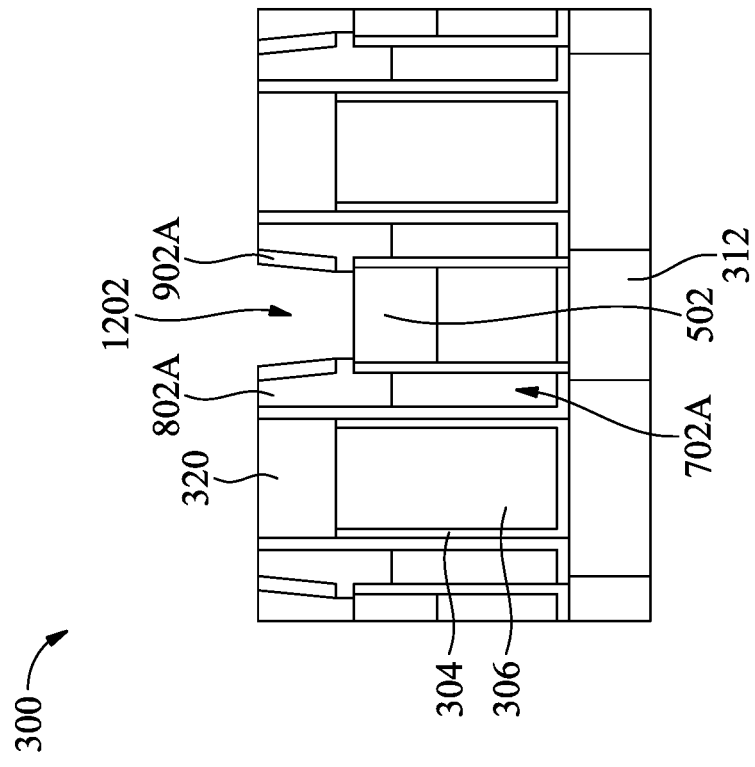

After the deposition and CMP process of block 218, the method 200 proceeds to block 220 where a first etch process and a second etch process are performed. In various embodiments, the first and second etch processes may include first and second SAC etch processes. Referring first to FIGS. 11 and 12, in an embodiment of block 220, a first SAC etch process may be performed, for example, that targets a source/drain region (e.g., over the epitaxial source/drain features 312) of the device 300. In particular, the first SAC etch process may be used to etch the second SAC layer 1102 (e.g., SiN) that was previously deposited over the exposed metal layer 502 and thus form a source/drain contact opening 1202. In various embodiments, the first SAC etch process may include an ALE etch process that provides a high etch selectivity (e.g., >12) of the second SAC layer 1102 (e.g., SiN) to the etched-back first sealing layer 802A, the etched-back second sealing layer 902A, and the first SAC layer 320 (e.g., $ZrO_2$). Thus, the first SAC etch process provides enhanced etch selectivity of SiN to the porous low-K spacer materials (e.g., SiOC). As a result of the high SiN to sealing layer (e.g., SiOC) etch selectivity, the etched-back first sealing layer 802A and an etched-back second sealing layer 902A are substantially not etched or broken during first SAC etch process and there is no damage to the air-gap spacer 702A, which remains sealed and unexposed. Further, the first SAC etch process results in no lateral damage, no bowing, and no damage to the etched-back metal contact layer 316A (e.g., Co) or the selectively deposited metal layer 502 (e.g., W). Additional details regarding the ALE etch process are discussed below with reference to FIGS. 14A-14D and 15A-15D. In various embodiments, after formation of the source/drain contact opening 1202, a metal layer may be deposited within the opening 1202 in contact with the metal layer 502, and thus provide an electrical connection to the epitaxial source/drain features 312.

Figure 13:
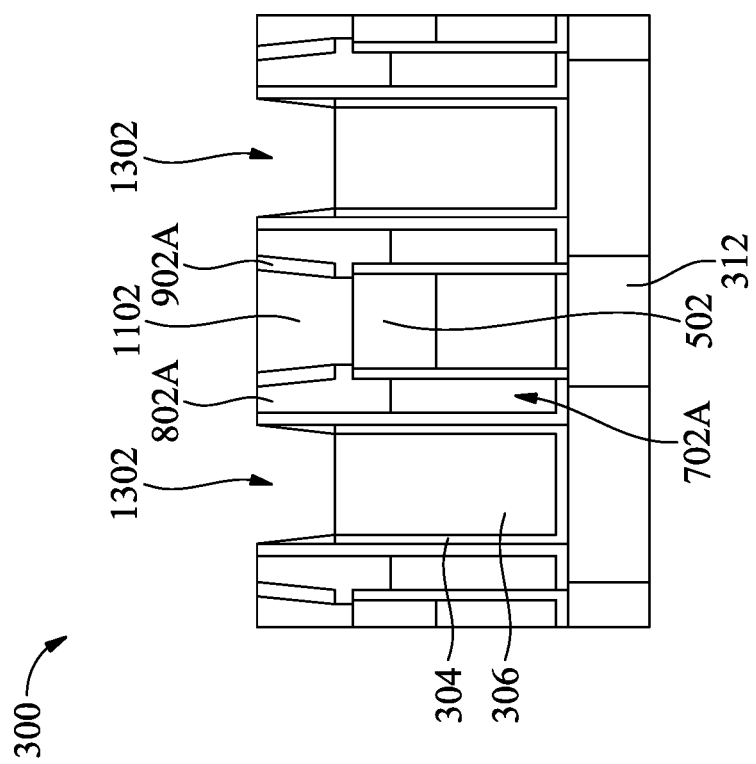

With reference now to FIGS. 11 and 13, in a further embodiment of block 220, a second SAC etch process may be performed, for example, that targets a gate region (e.g., over the gate stack including the gate dielectric layer 304 the metal layer 306) of the device 300. In particular, the second SAC etch process may be used to etch the first SAC layer 320 (e.g., $ZrO_2$) that was previously formed over the gate stack and thus form a gate contact opening 1302. In various embodiments, the second SAC etch process may also include an ALE etch process that provides a high etch selectivity (e.g., >12) of the first SAC layer 320 (e.g., $ZrO_2$) to the etched-back first sealing layer 802A, the etched-back second sealing layer 902A, and the second SAC layer 1102 (e.g., SiN). Thus, the second SAC etch process provides enhanced etch selectivity of $ZrO_2$ to the porous low-K spacer materials (e.g., SiOC). As a result of the high $ZrO_2$ to sealing layer (e.g., SiOC) etch selectivity, the etched-back first sealing layer 802A and an etched-back second sealing layer 902A are not damaged during the second SAC etch process and thus there is no damage to the air-gap spacer 702A, which remains sealed and unexposed. Further, the second SAC etch process results in no lateral damage, no bowing, and no damage to the metal layer 306 or any adjacent liner layer (e.g., such as TiN). In various embodiments, after formation of the gate contact opening 1302, a metal layer may be deposited within the opening 1302 in contact with the metal layer 306, and thus provide an electrical connection to the gate stack of the device 300. In some embodiments, the first SAC etch process may be performed before the second SAC etch process. However, in some cases, the second SAC etch process may be performed before the first SAC etch process.

The device 300 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

With reference now to FIGS. 14A-14D and 15A-15D, illustrated therein is an exemplary ALE etch process flow, for example, that may be employed during the first SAC etch process and/or the second SAC etch process of block 220 of the method 200. In some embodiments, FIGS. 14A-14D illustrate an exemplary first cycle of the ALE etch process flow, and FIGS. 15A-15D illustrate an exemplary second-to-N cycles of the ALE etch process flow. Generally, the high etch selectivity of SiN or $ZrO_2$ to the porous low-K spacer materials (e.g., SiOC) is achieved in part by repeated cycles of the ALE etch process. Also, while the example discussed below with reference to FIGS. 14A-14D and 15A-15D are described as applied to the first SAC etch process that etches the second SAC layer (e.g., SiN) formed over a source/drain region, a similar ALE etch process may be employed for the second SAC etch process that etches the first SAC layer (e.g., $ZrO_2$) formed over the gate stack to form a gate contact opening (e.g., such as the gate contact opening 1302). However, while H2 and fluorine plasma processes are used to etch SiN, as discussed below, when employing the ALE etch process to etch $ZrO_2$, different etch chemistries may be used. For example, in some embodiments, $BCl_3$ and/or $Cl_2$ based plasmas may be used to etch $ZrO_2$.

Referring now to FIG. 14A, illustrated therein is a device 1400 which may be substantially the same as the device 300, discussed above. Thus, in some embodiments, the device 1400 includes a first SAC layer 1402, which may be substantially the same as the first SAC layer 320 of the device 300. As such, the first SAC layer 1402 may include a dielectric layer such as a $ZrO_2$ layer. The device 1400 further includes a sealing layers 1404 and 1406 which may be substantially the same as the etched-back first and second sealing layers 802A and 902A, respectively, of the device 300. Thus, in various examples, the sealing layers 1404, 1406 may include a porous low-K material such as SiOC, SiN, SiC, SiON, SiOCN, SiCN, or combinations thereof. In some embodiments, the device 1400 also includes a second SAC layer 1408, which may be substantially the same as the second SAC layer 1102 of the device 300. Thus, in various examples, the second SAC layer 1408 may include a SiN layer. The device 1400 may further include a spacer layer 1410, which may be substantially the same as the first spacer layer 308 of the device 300. Thus, in various examples, the spacer layer 1410 may include a dielectric material such as silicon oxide, SiN, SiC, SiON, SiOC, SiOCN, SiCN, or combinations thereof.

In a first step of the ALE etch process flow, a surface modification process 1412 is performed (FIG. 14A), for example, using an H2 plasma to form a surface modification layer 1414 (FIG. 14B). As shown, the surface modification layer 1414 may be composed of different regions 1414A, 1414B, 1414C, 1414D, where the different regions may be defined based on the material at the top surface of the device 1400 that is exposed to, and thus reacts with, the H2 plasma of the surface modification process 1412. In the present example, the region 1414A corresponds to the first SAC layer 1402, the region 1414B corresponds to the spacer layer 1410, the region 1414C corresponds to the second SAC layer 1408, and the region 1414D corresponds to the sealing layers 1404, 1406.

In some embodiments, the excited hydrogen gas exposure to nitrogen of the SiN layer (e.g., of the second SAC layer 1408) may form an ammonia ($NH_3$) gas by-product in the modification layer 1414 and weaken bonds within the SiN layer. By way of example, the Si—N bond length (e.g., in the SiN layer) may increase due to H—N attraction and pull the N atom away from Si atom, and the Si—N bond energy may decrease, thereby resulting in a higher etch rate during a subsequent fluorine plasma process, discussed below. In some embodiments, a depth/thickness of the surface modification layer 1414 depends at least in part on a gas used to form the plasma and on the plasma power. In the case of an H2 plasma, the modification layer 1414 may be tuned to have a depth/thickness 'T3' in a range from about 7-20 nm, for example, depending on the underlying material layer. In various cases, the $H_2$ plasma penetration depth is deeper than either an Ar plasma or a He plasma. In particular, the $H_2$ plasma may provide a deeper modification depth with high power and a lower plasma pressure (e.g., as compared to an Ar or He plasma). As indicated above, the thickness of the surface modification layer 1414 may be different within the different regions 1414A, 1414B, 1414C, 1414D, corresponding to the different underlying material layers. In some examples, the thickness of the surface modification layer 1414 in the region 1414C may be greater than the thickness of the surface modification layer 1414 in the regions 1414A, 1414B, and 1414D, and the thickness of the surface modification layer 1414 in the regions 1414B and 1414D may be greater than the thickness of the surface modification layer 1414 in the region 1414A.

In a second step of the ALE etch process flow, a fluorine plasma process 1416 is performed, for example, to remove the surface modification layer 1414 in the region 1414C (e.g., from the SiN layer of the second SAC layer 1408) while keeping the surface modification layer 1414 on the other regions 1414A, 1414B, 1414D (e.g., including on SiOC surfaces of the sealing layers 1404, 1406 and on $ZrO_2$ surfaces of the first SAC layer 1402), as shown in FIGS. 14C and 14D. In some embodiments, the fluorine plasma process 1416 includes etching with F radicals to remove the surface modification layer 1414. By way of example, FIG. 14C may be described as illustrating the F radical reaction, and FIG. 14D may be described as illustrating a post-etch reaction, where additional SiN (e.g., of the second SAC layer 1408) is removed after the fluorine plasma process 1416. In some embodiments, the fluorine plasma process 1416 may help to form a volatile HCN by-product for removal of the SiN layer. On the other hand, the surface modification layer 1414 over the SiOC (e.g., of the sealing layers 1404, 1406) may act as an etch stop layer, for example, due in part to hydrogen enhanced surface polymer formation and stronger Si—O bonding. Generally, the ALE etch process flow provides a high SiN etch rate by the synergy of the sequential hydrogen plasma process 1412 and the fluorine plasma processes 1416. In various examples, a higher H dose in the surface modification layer 1414 may help to enhance/strengthen the SiOC (e.g., of the sealing layers 1404, 1406) and resist etching by the fluorine plasma process 1416.

FIG. 14C also illustrates an etch by-product layer 1420 that is formed during the fluorine plasma process 1416. As shown, the etch by-product layer 1420 formed on top of the first SAC layer 1402 and the sealing layers 1404, 1406 may be thicker than the etch by-product layer 1420 formed on the second SAC layer 1408, for example, due to weaker SiN bonding and easier SiN layer removal (from the second SAC layer 1408) resulting from the $H_2$ plasma modification (e.g., the surface modification process 1412). In some examples, and with respect to FIG. 14D, SiN (e.g., of the second SAC layer 1408) is removed due to having less surface passivation protection, while the first SAC layer 1402 and the sealing layers 1404, 1406 are protected by the thicker etch by-product layer 1420. As such, etch selectivity of the second SAC layer 1408 to the first SAC layer 1402 and the sealing layers 1404, 1406 is improved. In some embodiments, the etch by-product layer 1420 may be removed from surfaces of the device 1400 during a subsequent wet clean process (e.g., after removal of the SiN layer). It is also noted that while the spacer layer 1410 may include SiN in some examples, which is similar to the second SAC layer 1408, the spacer layer 1410 remains largely unetched due in part to the small critical dimension (CD) of the exposed portion of the spacer layer (e.g., as compared to adjacent layers), as well as by being substantially protected by the adjacent first SAC layer 1402 and the sealing layers 1404, 1406, which provide high etch selectivity to the second SAC layer 1408 during the ALE process.

Figure 15B:
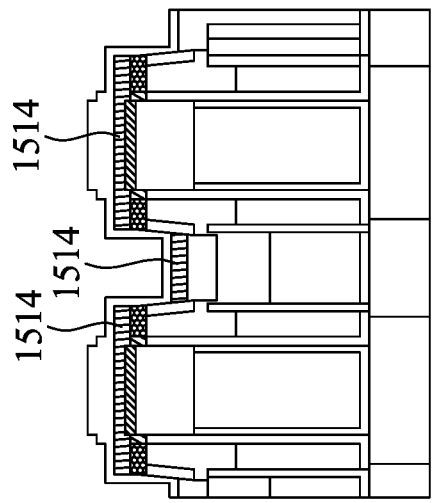
FIGS. 15A-15D illustrate an exemplary second-to-N cycles of the ALE etch process flow, according to some embodiments.
Figure 15D:
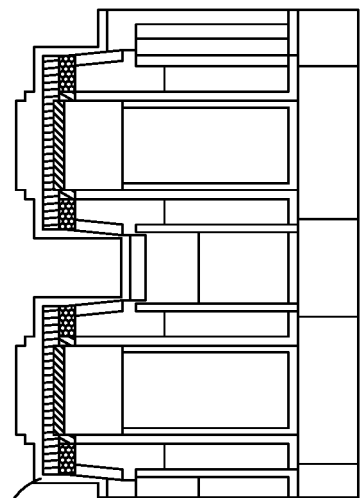
Figure 15A:
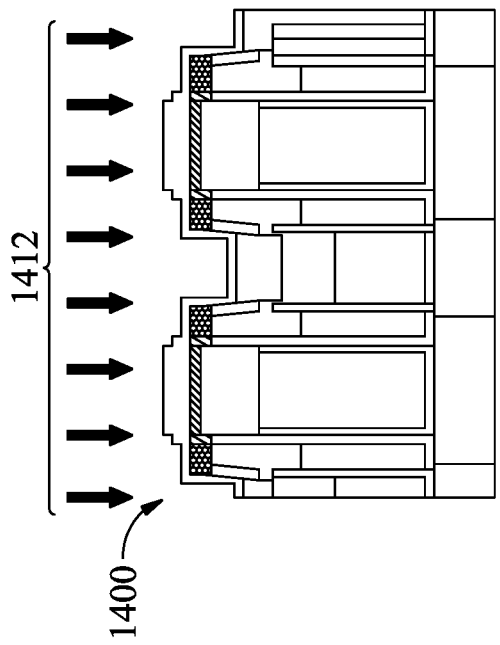
Figure 15C:
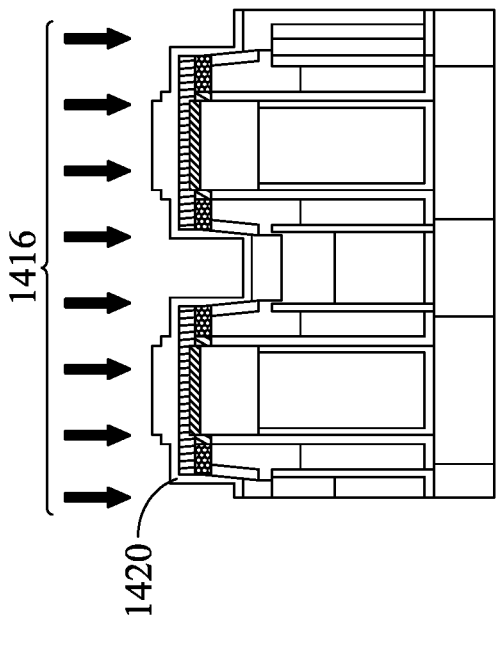

After the first cycle of the ALE etch process flow, as discussed with reference to FIGS. 14A-14D, the second-to-N cycles of the ALE etch process flow may generally proceed as shown in FIGS. 15A-15D. As noted above, the high etch selectivity of SiN or $ZrO_2$ to the porous low-K spacer materials (e.g., SiOC) may be achieved in part by repeated cycles of the ALE etch process. With reference to FIG. 15A, the surface modification process 1412 may once again be performed, for example, using the $H_2$ plasma on SiN and SiOC surfaces to form an additional surface modification layer 1514 (FIG. 15B) and/or to expand the previously existing surface modification layer 1414. It is noted that in some embodiments, the surface modification layer 1514 may also be composed of different regions, similar to the different regions described above with reference to the surface modification layer 1414. After forming the additional surface modification layer 1514 or expand the previously existing surface modification layer 1414, the fluorine plasma process 1416 may once again be performed, for example, to remove the surface modification layer 1514 from the SiN layer (e.g., of the second SAC layer 1408) while keeping the surface modification layer 1514 and/or 1414 on the other regions of the device 1400 (e.g., including on SiOC surfaces of the sealing layers 1404, 1406 and on $ZrO_2$ surfaces of the first SAC layer 1402), as shown in FIGS. 15C and 15D. In particular, FIG. 15C may be described as illustrating the F radical reaction, and FIG. 15D may be described as illustrating a post-etch reaction, where additional SiN (e.g., of the second SAC layer 1408) is removed after the fluorine plasma process 1416. The ALE etch process flow illustrated in FIGS. 15A-15D may then be repeated for N additional cycles, as needed, in order to completely etch the SiN layer (e.g., of the second SAC layer 1408) and expose the underlying metal layer (e.g., such as the metal layer 502) to form a source/drain contact opening (e.g., such as the source/drain contact opening 1202).

Stated another way, and with respect to FIGS. 15A-15D, the $H_2$ plasma surface modification process 1412 and the fluorine plasma process 1416 may be repeated to remove the SiN layer, where a key process control includes maintaining a thick surface modification layer (e.g., the surface modification layer 1514 and/or 1414) on top of the first SAC layer 1402 and the sealing layers 1404, 1416, while removing a thinner surface modification layer on the second SAC layer 1408 to etch away the second SAC layer 1408. Such optimized passivation layer control (e.g., surface modification layer control) further provides for the improved etch selectivity of the second SAC layer 1408 to the first SAC layer 1402 and the sealing layers 1404, 1406. The etch by-product layer 1420, also shown in FIGS. 15A-15D, may be removed from surfaces of the device 1400 during a subsequent wet clean process (e.g., after removal of the SiN layer).

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for providing air-gap spacers, protected by a plurality of sealing layers, that provide a reduced spacer dielectric constant and enhanced device performance. In some embodiments, first and second sealing layers may be formed over an air gap adjacent to a device gate structure to seal the air-gap spacer. In some examples, a porous low-K material (e.g., such as SiOC) may be used to form the plurality of sealing layers. In addition, as part of a dual SAC process flow, embodiments of the present disclosure provide a dielectric layer (e.g., SiN, ZrOx, etc.) etching process (e.g., an ALE etching process) having a high etch selectivity (e.g., >12) of the dielectric layer to the plurality of sealing layers (e.g., SiOC). In so doing, the various disclosed embodiments avoid air gap exposure/damage while minimizing gate height loss. Additional embodiments and advantages will be evident to those skilled in the art in possession of this disclosure.

Thus, one of the embodiments of the present disclosure described a method where a device including a gate stack, a plurality of spacer layers disposed on a sidewall of the gate stack, and a source/drain feature adjacent to the gate stack is provided. In some embodiments, a first spacer layer of the plurality of spacer layers is removed to form an air gap on the sidewall of the gate stack. In various examples, a first sealing layer is then deposited over a top portion of the air gap to form a sealed air gap. Thereafter, a first self-aligned contact (SAC) layer is etched from over the source/drain feature using a first etching process. In various embodiments, the first etching process selectively etches the first SAC layer while the first sealing layer remains unetched.

In another of the embodiments, discussed is a method where a spacer layer is removed from a sidewall of a FinFET gate stack to form an air gap on the sidewall of the FinFET gate stack. In some embodiments, a plurality of sealing layers is conformally deposited over a top portion of the air gap to form a sealed air gap. In some cases, a first atomic layer etching (ALE) process is performed to remove a SiN layer from over a source/drain adjacent to the FinFET gate stack. In various embodiments, the first ALE process selectively etches the SiN layer while the plurality of sealing layers remains unetched.

In yet another of the embodiments, discussed is a semiconductor device including a gate stack disposed over a first fin region, where a spacer layer is disposed on a first sidewall of the gate stack. In some embodiments, a source/drain contact metal is disposed over a second fin region adjacent to the first fin region, where the second fin region includes a source/drain feature, where a liner layer is disposed on a second sidewall of the source/drain contact metal, and where the first and second sidewalls face one another. In some examples, an air-gap spacer is disposed between the spacer layer and the liner layer, and a plurality of sealing layers are merged over a top portion of the air-gap spacer to seal and protect the air-gap spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device including a gate stack, a plurality of spacer layers disposed on a sidewall of the gate stack, and a source/drain feature adjacent to the gate stack;
removing a first spacer layer of the plurality of spacer layers to expose an underlying layer and form an air gap on the sidewall of the gate stack;
depositing a first sealing layer over a top portion of the air gap to form a sealed air gap;
after depositing the first sealing layer, performing a sealing layer etch-back process that exposes a top surface of an underlying selectively deposited metal layer, the underlying selectively deposited metal layer formed over an etched-back metal contact layer;
after performing the sealing layer etch-back process, depositing a first self-aligned contact (SAC) layer; and
after depositing the first SAC layer, etching the first SAC layer from over the source/drain feature using a first etching process, wherein the first etching process selectively etches the first SAC layer while the first sealing layer remains unetched.

2. The method of claim 1, further comprising:
depositing a second sealing layer over the first sealing layer; and
etching the first SAC layer from over the source/drain feature using the first etching process, wherein the first etching process selectively etches the first SAC layer while the second sealing layer remains unetched.

3. The method of claim 1, wherein the first etching process is an atomic layer etching process (ALE) including (i) a hydrogen plasma process that forms a surface modification layer over, and reacts with, the first SAC layer, and (ii) a fluorine plasma process that removes both the surface modification layer from the first SAC layer and at least a portion of the first SAC layer, and wherein the hydrogen plasma process and the fluorine plasma process are repeated for N cycles to remove the first SAC layer from over the source/drain feature.

4. The method of claim 1, wherein the device further includes a metal contact layer formed over, and providing electrical contact to, the source/drain feature, and wherein the method further comprises:
performing an etch-back process to the metal contact layer to form the etched-back metal contact layer; and
forming the underlying selectively deposited metal layer over the etched-back metal contact layer.

5. The method of claim 4, wherein the metal contact layer includes cobalt, and wherein the underlying selectively deposited metal layer includes tungsten.

6. The method of claim 1, further comprising:
prior to the removing the first spacer layer, performing an etch-back process to the first spacer layer.

7. The method of claim 1, wherein the device further includes a second SAC layer over the gate stack, and wherein the method further comprises:
etching the second SAC layer from over the gate stack using a second etching process, wherein the second etching process selectively etches the second SAC layer while the first sealing layer remains unetched.

8. The method of claim 7, wherein the first SAC layer includes SiN, and wherein the second SAC layer includes $ZrO_2$.

9. The method of claim 2, wherein the first sealing layer and the second sealing layer include a porous low-K material.

10. The method of claim 9, wherein the porous low-K material includes SiOC.

11. The method of claim 1, wherein an etch selectivity of the first SAC layer to the first sealing layer is greater than 12.

12. A method, comprising:
removing a spacer layer from a sidewall of a FinFET gate stack to expose an underlying layer and form an air gap on the sidewall of the FinFET gate stack;
conformally depositing a plurality of carbon-containing sealing layers over a top portion of the air gap to form a sealed air gap, wherein the plurality of carbon-containing sealing layers includes a first carbon-containing sealing layer having a first carbon content deposited over a second carbon-containing sealing layer having a second carbon content, and wherein the first carbon content is greater than the second carbon content; and
performing a first atomic layer etching (ALE) process to remove a SiN layer from over a source/drain adjacent to the FinFET gate stack, wherein the first ALE process selectively etches the SiN layer while the plurality of carbon-containing sealing layers remains unetched.

13. The method of claim 12, wherein the first ALE process includes (i) a hydrogen plasma process that forms a surface modification layer over, and reacts with, the SiN layer, and (ii) a fluorine plasma process that removes both the surface modification layer from the SiN layer and at least a portion of the SiN layer, and wherein the hydrogen plasma process and the fluorine plasma process are repeated for N cycles to remove the SiN layer from over the source/drain.

14. The method of claim 12, further comprising:
prior to forming the air gap, forming a selectively deposited tungsten layer over a cobalt layer, wherein the cobalt layer is disposed over, and provides electrical contact to, the source/drain.

15. The method of claim 14, further comprising:
prior to performing the first ALE process, depositing the SiN layer over the selectively deposited tungsten layer.

16. The method of claim 12, further comprising:
performing a second ALE process to remove a $ZrO_2$ layer from over the FinFET gate stack, wherein the second ALE process selectively etches the $ZrO_2$ layer while the plurality of carbon-containing sealing layers remains unetched.

17. The method of claim 12, wherein one or more of the plurality of carbon-containing sealing layers includes SiOC.

18. A semiconductor device, comprising:
a gate stack disposed over a first fin region, wherein a spacer layer is disposed on a first sidewall of the gate stack;
a source/drain contact metal disposed over a second fin region adjacent to the first fin region, wherein the second fin region includes a source/drain feature, wherein a liner layer is disposed on a second sidewall of the source/drain contact metal, and wherein the first and second sidewalls face one another;
an air-gap spacer disposed between the spacer layer and the liner layer; and
a plurality of sealing layers merged over a top portion of the air-gap spacer to seal and protect the air-gap spacer, wherein a first sealing layer of the plurality of sealing layers has a substantially vertical sidewall facing the gate stack in the first fin region and a tapered sidewall opposite the substantially vertical sidewall, the tapered sidewall facing the source/drain feature in the second fin region, wherein a second sealing layer of the plurality of sealing layers is disposed along the tapered sidewall of the first sealing layer, and wherein the second sealing layer has opposing tapered sidewalls and covers less than an entirety of the tapered sidewall of the first sealing layer.

19. The semiconductor device of claim 18, wherein the gate stack includes a metal layer having a height in a range from about 30-40 nm, wherein the air-gap spacer has a height in a range from about 25-35 nm, and wherein a thickness of the plurality of sealing layers is in a range from about 5-10 nm.

20. The method of claim 12, wherein the first carbon content of the first carbon-containing sealing layer is between 10-20%, and wherein the second carbon content of the second carbon-containing sealing layer is between 2-10%.

* * * * *